United States Patent [19]
Jung

[11] Patent Number: 5,856,215
[45] Date of Patent: Jan. 5, 1999

[54] METHOD OF FABRICATING A CMOS TRANSISTOR

[75] Inventor: Chae Hyun Jung, Youngchon, Rep. of Korea

[73] Assignee: Hyundai Electronics Industries Co., Ltd., Kyungki-do, Rep. of Korea

[21] Appl. No.: 701,585

[22] Filed: Aug. 22, 1996

[30] Foreign Application Priority Data

Aug. 25, 1995 [KR] Rep. of Korea ........................ 95-26537

[51] Int. Cl.⁶ .............................................. H01L 21/8238
[52] U.S. Cl. .......................... 438/199; 438/225; 438/297; 257/274
[58] Field of Search .................................. 438/199, 225, 438/297, 168, 216, 351; 257/274

[56] References Cited

U.S. PATENT DOCUMENTS

| 4,782,037 | 11/1988 | Tomozawa et al. | 437/56 |
| 4,853,340 | 8/1989 | Komatsu | 437/57 |
| 5,338,986 | 8/1994 | Kurimoto | 307/303.2 |
| 5,464,789 | 11/1995 | Saito | 437/34 |
| 5,506,161 | 4/1996 | Orlowski et al. | 437/57 |

FOREIGN PATENT DOCUMENTS

| 0107066 | 7/1982 | Japan | 437/56 |
| 0017655 | 2/1983 | Japan | 437/34 |
| 0289157 | 11/1989 | Japan | 437/56 |
| 0040463 | 2/1991 | Japan | 437/56 |

Primary Examiner—John Niebling
Assistant Examiner—Long Pham
Attorney, Agent, or Firm—Fish & Richardson P.C.

[57] ABSTRACT

The present invention relates to a method of fabricating a CMOS transistor which can further reduce the size of a chip since it is not necessary to consider the metal contact process margin since a gate electrode of a PMOS transistor and a gate electrode of an NMOS transistor are directly connected with a polysilicon wiring during a process of forming the gate electrodes, which can prevent the formation of a parasitic transistor by forming a cell space region in an active region below the polysilicon wiring.

4 Claims, 4 Drawing Sheets

METHOD OF FABRICATING A CMOS TRANSISTOR

BACKGROUND OF THE INVENTION

FIELD OF THE INVENTION

The present invention relates to a method of fabricating a Complementary Metal Oxide Semiconductor(CMOS) and particularly to a method of fabricating a CMOS transistor which can prevent formation of a parasitic transistor between a PMOS transistor and an NMOS transistor, and also reduce the size of the chip.

BACKGROUND OF THE INVENTION

In general, a CMOS transistor is fabricated by forming an N-well in a portion of a P-substrate, forming the PMOS transistor in the N-well, forming the NMOS transistor in the P-substrate, and interconnecting a gate electrode of the PMOS transistor and a gate electrode of the NMOS transistor. The gate electrode is generally formed from a polysilicon. In the operation of the CMOS transistor, a latch-up phenomenon occurs to lower the reliability of the transistor. To prevent the latch-up phenomenon, in the process of separation of elements to define a field region and an active region, a pick-up region is formed by making an edge portion of the N-well to be included in the active region and implanting $N^+$ impurity ions into the active region of the edge portion of the N-well. In the case where the pick-up region is formed along the edge of the N-well, as described above, wiring for interconnecting the gate electrode of the PMOS transistor and the gate electrode of the NMOS transistor passes over the pick-up region. An insulation film is formed between the wiring and the pick-up region. In the case where the wiring is formed from the polysilicon which forms the gate electrode, there is a disadvantage in that the polysilicon wiring and the pick-up region which are formed have the insulation film between them act as a parasitic transistor, which can degrade the electrical performance of the CMOS transistor. A method for solving such a disadvantage is described below with reference to FIGS. 1, 2A and 2B.

FIG. 1 is a layout of a prior art CMOS transistor, FIG. 2A is a sectional view taken along a line X–X' of FIG. 1, and FIG. 2B is a sectional view taken along a line Y–Y' of FIG. 1.

Referring to FIGS. 1, 2A and 2B, N-well 11 is formed in a portion of P-substrate 1. After the field region and active region are defined by the element separation process, the filed oxide film 2 is formed in the field region through an oxidation process. The PMOS transistor 10 is formed in the N-well 11, and the NMOS transistor 20 is formed in the P-substrate 1. The PMOS transistor 10 comprises the first gate electrode 12 and a first and second junction parts 13A and 13B for source and drain. The NMOS transistor 20 comprises the second gate electrode 22 and a third and fourth junction parts 23A and 23B for source and drain. The first and second gate electrodes 12 and 22 are formed by a polysilicon depositing process and patterning process, respectively. The pick-up region 3 is formed along the edge of the N-well 11 through $N^+$ impurity ion implantation process. After the pick-up region 3 is formed, an interlayer insulation film 4 is formed on the resulting structure. Thereafter, through a metal contact process, the first junction part 13A of the PMOS transistor 10 and the third junction part 23A of the NMOS transistor 20 are connected by a first metal wiring 5A, the second junction part 13B of the PMOS transistor 10 and the fourth junction part 23B of the NMOS transistor 20 are led out to other portions by a second metal wiring 5B, and the first gate electrode 12 of PMOS transistor 10 and the second gate electrode 22 of NMOS transistor 20 are connected by a third metal wiring 5C.

Since the first and second gate electrodes 12 and 22 are interconnected by utilizing a metal, the formation of the parasitic transistor in the portion of the pick-up region 3 can be prevented. The areas of the first gate electrode 12 and the second gate electrode 22 have to be large considering the contact margin, which limits the reduction of the size of the chip.

SUMMARY OF THE INVENTION

Therefore, the object of the present invention is to provide a CMOS transistor which can prevent formation of a parasitic transistor between a PMOS transistor and an NMOS transistor, and also reduce the size of a chip.

A method of fabricating a CMOS transistor to achieve the above described object is characterized in that it comprises the steps of: defining a field region and active region in a P-substrate formed with an N-well through an element separation process; forming a field oxide film in the field region through an oxidation process; forming a cell space region in a selected portion of an edge of the N-well by a cell $N^+$ impurity ion implantation process; forming a PMOS transistor having a common gate electrode, a first junction portion and a second junction portion in said N-well, and an NMOS transistor having the common gate, a third junction portion and a fourth junction portion; forming a pick-up region along the edge of the N-well by a $N^+$ impurity ion implantation process; forming an interlayer insulation film on the entire top after forming the pick-up region; and connecting, through a metal contact process, the first junction portion and the third junction portion with a first metal wiring, and the second junction portion and the fourth junction portion with a second metal wiring.

BRIEF DESCRIPTION OF THE DRAWINGS

For fuller understanding of the nature and objects of the invention, reference should be made to the following detailed description taken in conjunction with the accompanying drawings in which.

Similar reference characters refer to similar parts in the several views of the drawings.

DETAILED DESCRIPTION OF THE INVENTION

Figure 1:
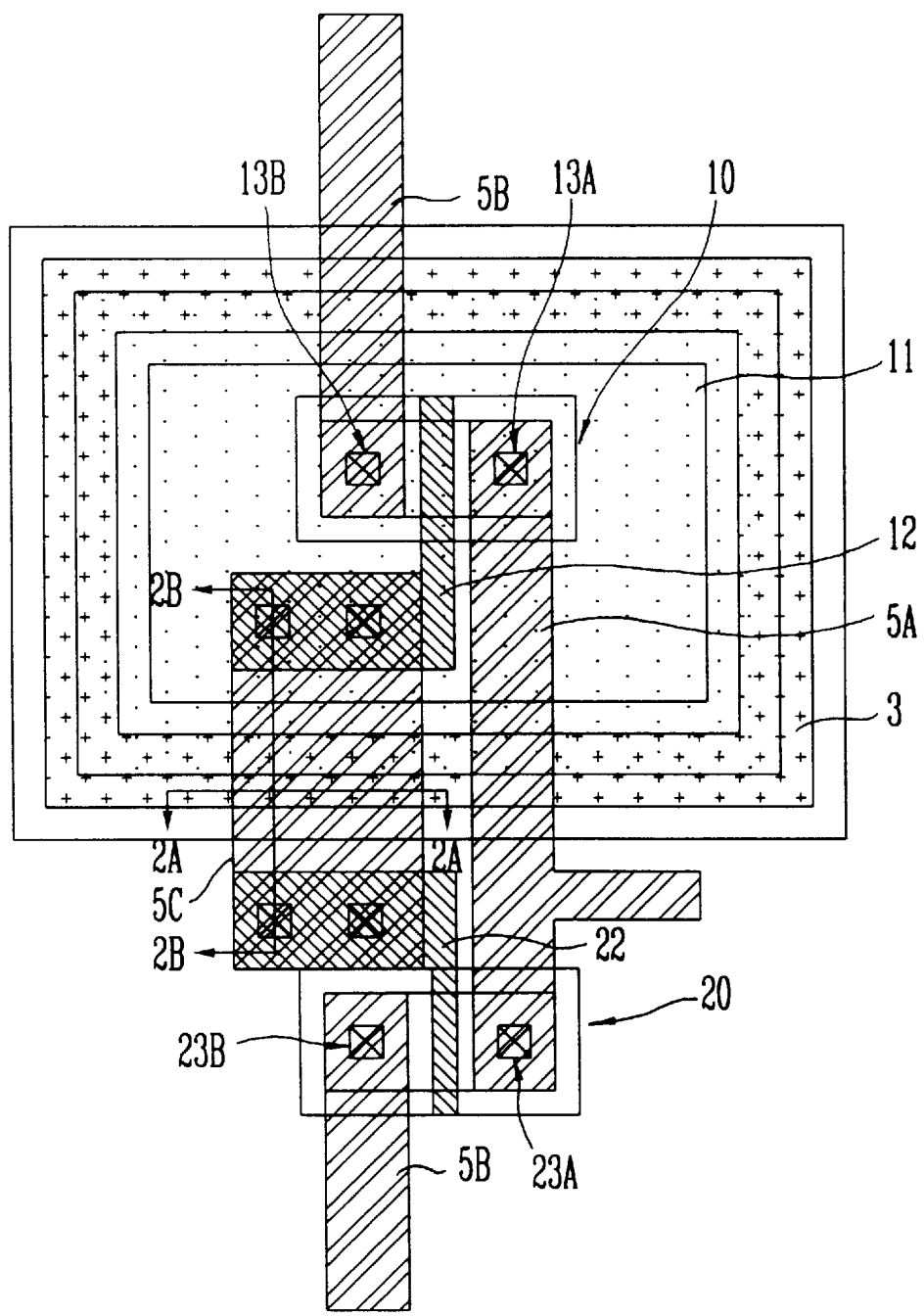
FIG. 1 is a layout of a prior art CMOS transistor.
Figure 2A:
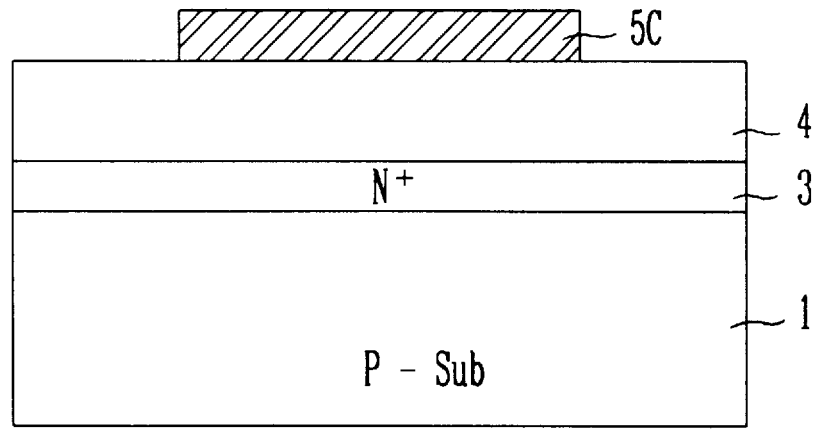
FIG. 2A is a sectional view taken along a line X–X' of FIG. 1.
Figure 2B:
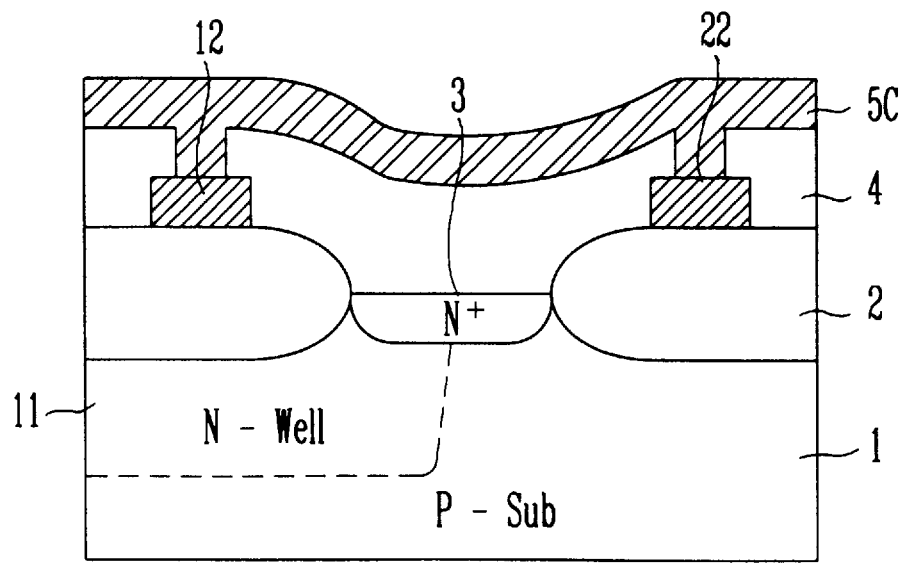
FIG. 2B is a sectional view taken along a line Y–Y' of FIG. 1.

FIG. 1 is a layout of a prior art CMOS transistor, FIG. 2A is a sectional view taken along a line X–X' of FIG. 1, FIG. 2B is a sectional view taken along a line Y–Y' of FIG. 1, and these drawings are already discussed above.

Figure 3:
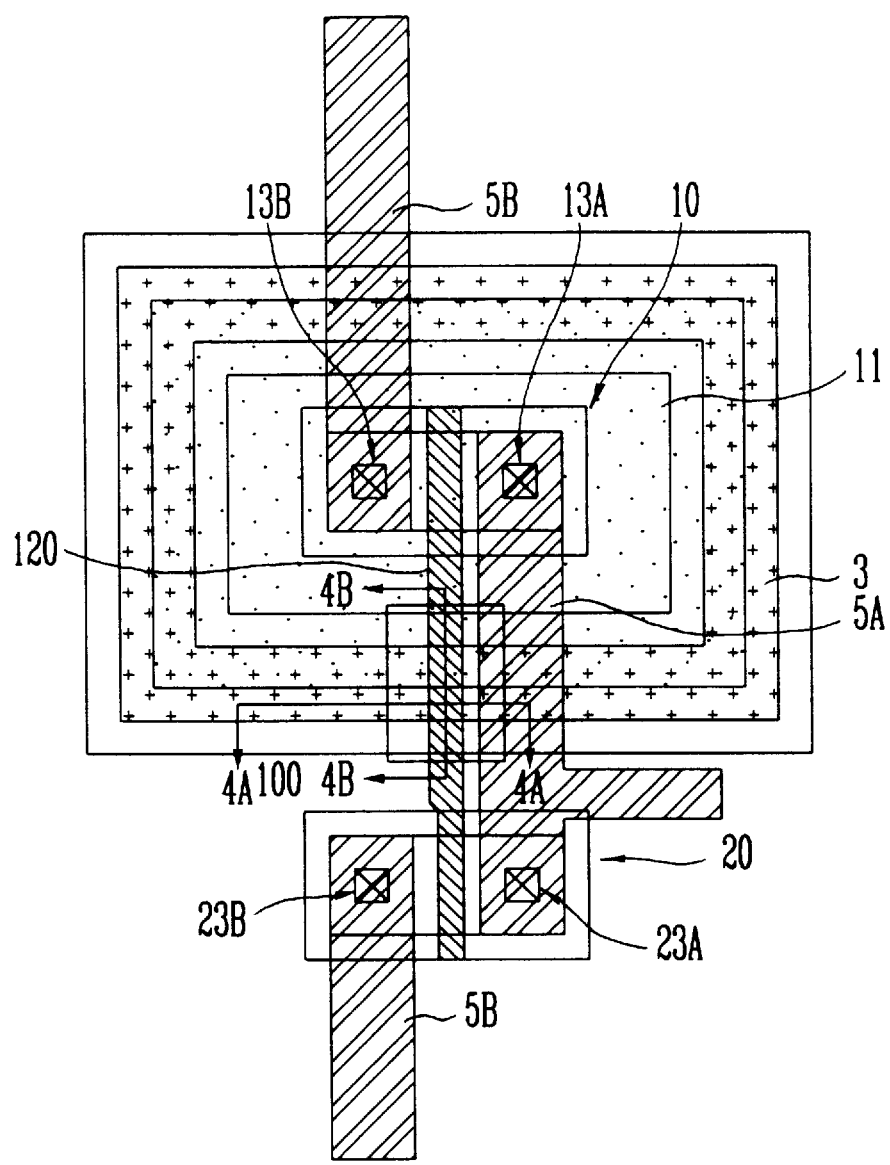
FIG. 3 is a layout of a prior art CMOS transistor.
Figure 4A:
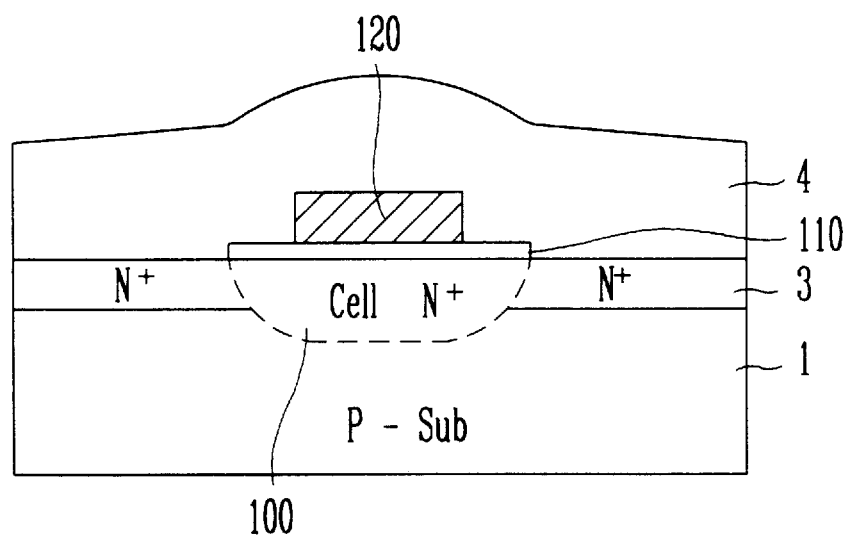
FIG. 4A is a sectional view taken along a line X–X' of FIG. 3.
Figure 4B:
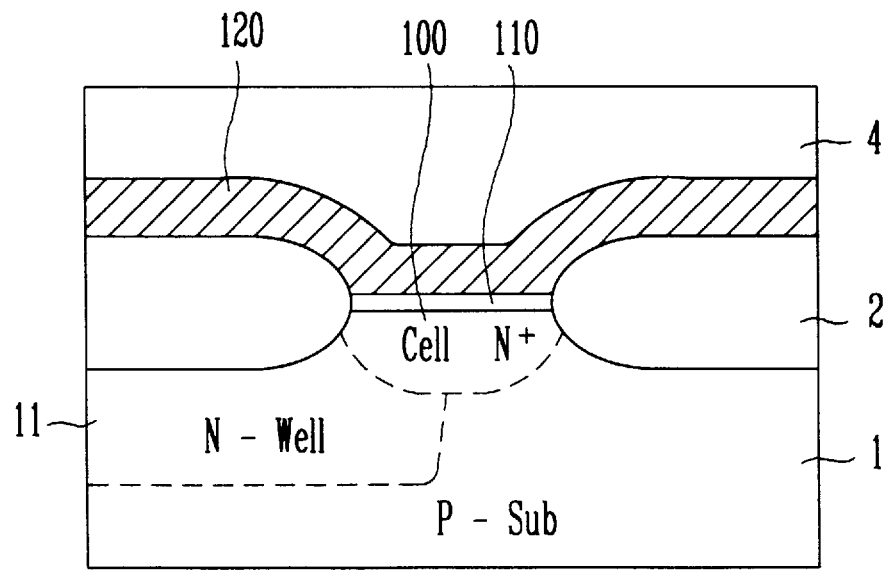
FIG. 4B is a sectional view taken along a line Y–Y' of FIG. 3.

Referring to FIGS. 3, 4A and 4B, N-well 11 is formed in a portion of P-substrate 1. After the field region and active region are fixed by the element separation process, the field oxide film 2 is formed in the field region through an oxidation process. A cell space region 100 is formed in a selected portion of the edge of N-well 11 by a cell N$^+$ impurity ion implantation process. The PMOS transistor 10 is formed in N-well 11, and the NMOS transistor 20 is formed in the P-substrate 1. The PMOS transistor 10 comprises a common gate electrode 120 and the first and second junction parts 13A and 13B for source and drain. The NMOS transistor 20 comprises a common gate electrode 120 and the third and fourth junction parts 23A and 23B for source and drain. The common gate electrode 120 is formed through the polysilicon deposition process and patterning process so as to interconnect the PMOS transistor 10 and NMOS transistor 20 and pass over the cell space region 100. A thick oxide film 110 is formed between the cell space region 100 and the common gate electrode 120 which passes over the cell space region 100, and this thick oxide film 110 is formed during the process of forming the gate oxide film of the transistors 10 and 20. The pick-up region 3 is formed along the edge of the N-well 11 through the N$^+$ impurity ion implantation process and is connected to the cell space region 100. After the pick-up region 3 is formed, the interlayer insulation film 4 is formed on the resulting structure. Thereafter, through a metal contact process, the first junction part of the PMOS transistor 10 and the third junction part 23A of the NMOS transistor 20 are connected by the first metal wiring 5A, and the second junction part 13B of the PMOS transistor 10 and the fourth junction part 23B of the NMOS transistor 20 are led out to other portions by a second metal wiring 5B.

Since the gate electrode of the PMOS transistor and the gate electrode of the NMOS transistor are directly connected with the polysilicon wiring during the process of forming the gate electrodes as described above, it is not necessary to consider the metal contact process margin so that the size of the chip can be further reduced, and since the cell space region is formed in the active region below the polysilicon wiring, the formation of the parasitic transistor can be prevented.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of fabricating a CMOS transistor, comprising:

forming an N-well in a portion of a P-substrate;

defining field regions and active regions on said N-well and said P-substrate using an element separation process;

forming a field oxide film in said field regions, respectively;

forming a first N$^+$ diffusion region between said active regions at an edge of said N-well;

forming a common gate electrode on said P-substrate and said N-well;

forming a first source and drain in said N-well having said common sate electrode as a first gate to form a PMOS transistor;

forming a second source and drain in said P-substrate having said common gate electrode as a second gate to form an NMOS transistor;

forming a second N$^+$ diffusion region along said edge of said N-well, wherein said second N$^+$ diffusion region is connected to said first N$^+$ diffusion region at said edge of said N-well;

forming an interlayer insulation film on the resulting structure after forming said second N$^+$ diffusion region; and connecting, through a metal contact process, said first junction portion and said third junction portion with a first metal wiring, and second junction portion and said fourth junction portion with a second metal wiring.

2. The method as claimed in claim 1, wherein said common gate electrode of said PMOS transistor and NMOS transistor is formed to pass over said first N$^+$ diffusion region.

3. The method as claimed in claim 1, further comprising an oxide film which is formed between said first N$^+$ diffusion region and common gate electrode.

4. The method as claimed in claim 3, wherein said oxide film is formed during a process of forming a gate oxide film of said NMOS and PMOS transistors.

* * * * *